United States Patent [19]
Hübner

[11] Patent Number: 5,706,578
[45] Date of Patent: Jan. 13, 1998

[54] METHOD FOR PRODUCING A THREE-DIMENSIONAL CIRCUIT ARRANGEMENT

[75] Inventor: Holger Hübner, Baldham, Germany

[73] Assignee: Siemens Aktiengesellschaft, Munich, Germany

[21] Appl. No.: 693,143

[22] PCT Filed: Feb. 2, 1995

[86] PCT No.: PCT/DE95/00137

§ 371 Date: Aug. 13, 1996

§ 102(e) Date: Aug. 13, 1996

[87] PCT Pub. No.: WO95/22840

PCT Pub. Date: Aug. 24, 1995

[30] Foreign Application Priority Data

Feb. 16, 1994 [DE] Germany .................. 44 04 905.6
Aug. 3, 1994 [DE] Germany .................. 44 27 516.1

[51] Int. Cl.⁶ .................. H01L 25/065; H01L 21/60
[52] U.S. Cl. .................. 29/830; 29/846; 174/259; 174/263
[58] Field of Search .................. 29/830, 846, 840, 29/829, 825, 860; 174/255, 259, 256, 263, 262, 261, 250

[56] References Cited

U.S. PATENT DOCUMENTS

| | | | |
|---|---|---|---|
| 4,285,780 | 8/1981 | Schachter | 29/830 X |
| 5,072,075 | 12/1991 | Lee et al. | 29/846 X |
| 5,274,912 | 1/1994 | Olenick et al. | 29/830 |
| 5,590,461 | 1/1997 | Ishida | 29/830 |

FOREIGN PATENT DOCUMENTS

| | | |
|---|---|---|
| 0 374 971 A2 | 6/1990 | European Pat. Off. |
| 4225138 A1 | 2/1994 | Germany. |
| 4241439 A1 | 6/1994 | Germany. |

OTHER PUBLICATIONS

Petent Abstract of Japan, E–1207, May 26, 1992, vol. 16, No. 227, for JP 4–42957 A 13 Feb. 1992, Manufacture of Semiconductor Integrated Circuit Device, Seiji Ueda, 1 sheet.

IEEE Micro, Bd. 13, (1993), Amalgams for Improved Electronics Interconnection, C.A. MacKay, pp. 46–58.

Microelectronic Engineering, 15, Oct. 1991, Results of the Tghree–Dimensional Integrated Circuits Probect in Japan, T. Moriya et al, pp. 167–174.

Symposium on VLSI Technology, Fabrication of Three–Dimensional IC Using "Cumulatively Bonded IC" (Cubic) Technology, Y. Hayashi et al, pp. 95–96.

*Primary Examiner*—James F. Coan
*Attorney, Agent, or Firm*—Hill, Steadman & Simpson

[57] ABSTRACT

Substrates (11, 12) each of which having components with contacts (13, 14) are arranged one above the other in a stack in order to produce a three-dimensional circuit arrangement. Metal surfaces (20) are applied onto that main surface (15) of at least one of the substrates (11) which is adjacent to the other substrate, which metal surfaces (20) are soldered to the adjacent main surface (17) of the other substrate (12) in order to produce the mechanical joint between the two substrates (11, 12). The components can be tested before the application of further substrates, and substrates having faulty components are removed by grinding away into the metal surfaces (20).

14 Claims, 2 Drawing Sheets

METHOD FOR PRODUCING A THREE-DIMENSIONAL CIRCUIT ARRANGEMENT

BACKGROUND OF THE INVENTION

Semiconductor circuits are increasingly being designed in which integrated circuits are stacked one above the other in a plurality of planes and are connected to one another. Integrated circuits from various technologies are, in particular, combined in this way.

In order to increase the packing density and to shorten the connecting paths, such stacks of different integrated circuits are combined in one chip casing. In this case, the substrates including the integrated circuits, which may be composed of different substrate materials and/or may be manufactured using different technologies are in each case ground to a thickness of a few tens of micrometers and are arranged as a stack. Contacts are formed in the vertical direction through the substrates. Such a component stack when viewed from the outside appears as a new semiconductor module. It can be implemented in a standard casing with a reduced number of connections, even though it has increased functionality.

It is known from Y. Hayashi et al., Symposium on VLSI Technology (1990) pages 95 and 96 for a polyimide layer to be used as an adhesive layer for the mechanical joint between adjacent substrates. The vertical contacts between adjacent substrates are implemented via tungsten pins and associated large-area depressions which are filled with a gold/indium alloy. The tungsten pins enter these filled depressions when the upper substrate and the lower substrate are being stacked one above the other. They are soldered at 300° to 400° C. In this case, the two planes exhibit different thermal expansions and this leads to a lateral shift of the metal contacts, which can be sheared off at the same time.

As a result of the increased packing densities in three-dimensional integrated circuit arrangements, the heat losses to be dissipated rise in such a component stack. The polyimide layer scarcely makes any contribution to the dissipation of the heat losses, so that they must be dissipated via the tungsten pins and the substrates themselves.

SUMMARY OF THE INVENTION

The invention is based on the problem of specifying a method for producing a three-dimensional circuit arrangement, by means of which method a three-dimensional circuit arrangement can be produced in which mechanical stresses, which are caused by different thermal expansions when the substrates are connected, are reduced.

In general terms the present invention is a method for producing a three-dimensional circuit arrangement. A first substrate and a second substrate, each of which having at least one component with contacts, are arranged one above the other in a stack. The metal surfaces are applied onto that main surface of at least one of the substrates which is adjacent to the other substrate. The metal surfaces are soldered to the adjacent main surface of the other substrate by application of solder metal and heating. The solder metal mixes completely with the material of the metal surfaces so that an intermetallic phase is formed. A firm joint is produced between the first substrate and the second substrate. The materials of the metal surfaces and the solder metal are matched to one another such that the melting temperature of the intermetallic phase is higher than the operating temperature of the three-dimensional circuit arrangement and is higher than the melting temperature of the pure solder metal. Insulating trenches are formed between the metal surfaces and adjacent contacts, which are arranged on the same main surface.

The metal surfaces include nickel and the solder metal includes gallium. The quantity of solder metal is dimensioned such that an intermetallic phase having a gallium component of a maximum of 25 percent by weight forms after the complete mixing with the material of the metal surfaces.

Additional metal surfaces, each of which are adjacent to one of the first-mentioned metal surfaces, are applied on the main surface of the respective other substrate. The first-mentioned metal surfaces are soldered to the adjacent additional metal surfaces. The additional metal surfaces are formed from tungsten.

Contacts in both substrates are adjacent to the main surface which is adjacent to the other substrate. During soldering, the solder metal forms an electrical connection between contacts with which contact is to be made, on the first substrate and on the second substrate.

The insulating trenches are filled with material which is not wetted by the solder metal.

The insulating trenches have a width of at least 1 μm. The solder metal is applied as a layer with a thickness of at most 1 μm. The insulating trenches are filled with polyimide or silicone.

The base of the insulating trench is at least partially covered by an auxiliary layer which cannot be wetted by the solder metal. The auxiliary layer covers at least the edge of the base of the insulating trench. The auxiliary layer covers flanks of the metal surfaces which are adjacent to the insulating trenches. The auxiliary layer is arranged under the metal surface. The auxiliary layer is formed from tungsten, tantalum, aluminum, titanium oxide, tantalum oxide, chromium oxide, a nitride or a polymer.

At least one metal surface is formed for the electrical connection of a first contact in the first substrate and a second contact in the second substrate. They do not meet one another in the region of the mutually adjacent main surfaces, such that the metal surface forms an interconnect between the first contact and the second contact.

A diffusion barrier layer is applied onto the first-mentioned metal surfaces before the application of the solder metal. The diffusion barrier layer delays the diffusion of the solder metal into the first-mentioned metal surfaces.

After the first substrate and the second substrate have been joined by soldering, the components included therein are tested. If faulty components occur, the substrate including them is removed by grinding away. The solder metal is removed during the grinding away operation and is ground as far as the metal surfaces which are arranged on the remaining substrate, such that a new substrate can be soldered via these metal surfaces to the remaining substrate.

The term "substrate" is used here both for substrate wafers, which are composed in particular of semiconductor material and comprise microelectronic circuit structures and/or optoelectronic components and/or sensor components, and for discrete components, optoelectronic components, sensor elements or the like.

The term "component" is used both for microelectronic circuit structures and for optoelectronic components, sensor components or the like.

In order to construct a three-dimensional circuit arrangement, it is expedient to position separate components as a second substrate in each case above a component, which has been tested and been found to be good, of the substrate wafer, on a substrate wafer which comprises a multiplicity of components. After the electrical and mechanical connection between two substrates, it is once again expedient to test the circuit arrangement, since the components may be damaged during the various processing steps. The effective yield in the production of three-dimensional integrated circuit arrangements is increased by tests in each case after fitting a further substrate.

In the method according to the invention, the mechanical joint between adjacent substrates is implemented via metal surfaces which are arranged on at least one adjacent main surface of one of the substrates and are soldered to the adjacent main surface of the other substrate by application of solder metal and heating. The mechanical joint is made via metal surfaces, which ensures that the heat losses are transported-away in a better manner than in the prior art in a three-dimensional circuit arrangement which has been produced using the method according to the invention.

The metal surfaces are formed from a material which mixes with the solder metal to form an intermetallic phase whose melting temperature is higher than the operating temperature of the three-dimensional circuit arrangement. The solder metal mixes completely with the material of the metal surfaces, so that no pure solder metal remains between the substrates after soldering. Further planes can be added to the three-dimensional circuit arrangement using the same method, without any need to worry about melting of solder joints which have already been made. The metal surfaces are preferably formed from nickel. Gallium is then used as the solder metal.

The quantity of solder metal is in this case dimensioned such that an intermetallic phase having a gallium component of a maximum of 25 percent by weight is formed during the mixing with the material of the additional metal surfaces. Such an intermetallic phase has a melting temperature of more 1200° C.

When soldering the two substrates, care must be taken to ensure that the reaction of the solder metal and the material of the metal surfaces does not start until both substrates are in contact via the liquid solder metal. This can be ensured by the substrates not being heated until the metal surfaces are touching the solid solder metal.

Alternatively, the surface of those metal surfaces is provided, before the application of the solder metal, with a diffusion barrier layer-composed of, for example, Ti or TiN, which delays the diffusion of the solder metal into the material of the metal surface. In this case, the solder metal can be heated and liquefied, and then brought into contact with the metal surfaces.

It is within the scope of the invention for additional metal surfaces, which are in each case adjacent to one of the first-mentioned metal surfaces, to be applied on the main surface of the respective other substrate, and for the first-mentioned metal surface to be soldered to the adjacent additional metal surfaces. This avoids, inter alia, problems with the solder metal wetting the main surface of the other substrate.

The additional metal surfaces are preferably formed in the method according to the invention from a metal which mixes only slightly with the solder metal during soldering. In consequence, the additional metal surface scarcely changes at all during soldering. The additional metal surfaces are preferably formed from tungsten which is only slightly soluble in other metals.

If a faulty component is found during testing of substrates which have been assembled using the method according to the invention, then it is within the scope of the invention to grind away the entire substrate, with the faulty component, mechanically. Grinding methods which are known for the grinding of optical lenses and prisms are preferably used for this purpose. A planar grinding wheel with liquid diamond grinding paste having grain sizes of, for example, ¼ μm is used, in particular, in this case. The solder metal is also removed during the grinding away. The additional metal surfaces are ground. After this, the surface of the substrate with the additional metal surfaces has precisely the shape which it had before the application of the solder metal and of the second-substrate. Apart from a cleaning step, no further process steps are thus required to restore the surface of the substrate with the additional metal surfaces before a further substrate is in turn stacked on it and is thus mechanically joined to it.

Using the method according to the invention, any desired number of substrates can be arranged one above the other and can be joined to one another. It is in this case advantageous to test the serviceability of the three-dimensional circuit arrangement in each case after the application of a further substrate, and, if necessary, to remove the last substrate added by grinding away.

With respect to possible subsequent grinding away of faulty substrates, it is advantageous to provide a diffusion barrier layer on the metal surfaces on that substrate which will be used for the further construction of the three-dimensional circuit arrangement after the grinding away of the faulty substrate which as a rule is that which has been added to it. The diffusion barrier layer in this case ensures that the metal surfaces remain essentially unchanged during soldering.

It is within the scope of the invention for contacts which are adjacent, in both substrates, to the main surface adjacent to the other substrate to be electrically connected to one another during soldering. When contacts meet one another in the two substrates, this is carried out via direct soldering. In the case of substrates which are arranged offset, it is within the scope of the invention to construct at least one metal surface such that it forms an interconnect between the two contacts, parallel to the main surface of the substrates. Since contacts which are to be connected meet one another in a planar manner and do not intermesh, as is the case in the prior art, different thermal expansion levels lead only to a lateral shift. Mechanical stresses on the contacts are thus avoided.

The contacts which are adjacent to the main surface must be capable of being soldered with the same solder metal as the metal surfaces. In this-case, the contacts can be formed from the same metal as the metal surfaces, which leads to a simplification of the process. It is likewise possible to form contacts from different metals than the metal surfaces. In this case, the electrical characteristics of the contacts can be optimized independently of the mechanical characteristics of the metal surfaces. Copper, silver or tungsten, inter alia, are suitable as the metal for the contacts.

In order to avoid accidental electrical connections between metal surfaces and adjacent contacts it is within the scope of the invention for insulating trenches to be constructed between adjacent metal surfaces and contacts. The insulating trenches which are adjacent to the metal surfaces furthermore allow enclosed air or gas to escape when adjacent substrates are being joined together. Particularly when large-area substrates are being joined, there is a risk of closed edge regions being connected before it has been possible for the air or barrier-gas atmosphere between the adjacent substrates to escape completely. In this case, an enclosed air cushion is formed, which would prevent complete connection of the substrates. However, this air or gas can escape via the insulating trenches.

In order to ensure that a short circuit between the metal surfaces and adjacent contacts is prevented, the base of the insulating trenches is covered at least at the edge with an auxiliary layer which cannot be wetted by the solder metal. The auxiliary layer is constructed, in particular, as a flank cover along the adjacent flanks of the metal surfaces. Alternatively, the auxiliary layer is arranged under the metal surface.

The auxiliary layer is preferably formed from tungsten, tantalum, aluminum or a polymer.

If the auxiliary layer is composed of a material having sufficient electrical conductivity, that is to say a metal, then the auxiliary layer must be interrupted between a metal surface and an adjacent contact in the region of the insulating trench, in order to avoid short circuits between the metal surface and the contact.

Since the auxiliary layer composed of material which cannot be wetted is arranged at the edge of the metal surfaces and contacts, the solder metal tears off at the edge of the metal surfaces and contacts. Meniscuses are then formed at the edges of the metal surfaces during the soldering process. The surface tension of the liquid solder metal prevents it forming a short circuit with the liquid solder metal on the adjacent contact.

Alternatively, these insulating trenches are filled with material which is not wetted by solder metal. Silicone or polyimide are suitable, for example, for this purpose. Meniscuses are formed at the edges of the metal surfaces during the soldering process. The surface tension of the liquid solder metal prevents it forming a short circuit with the liquid solder metal on the adjacent contact.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
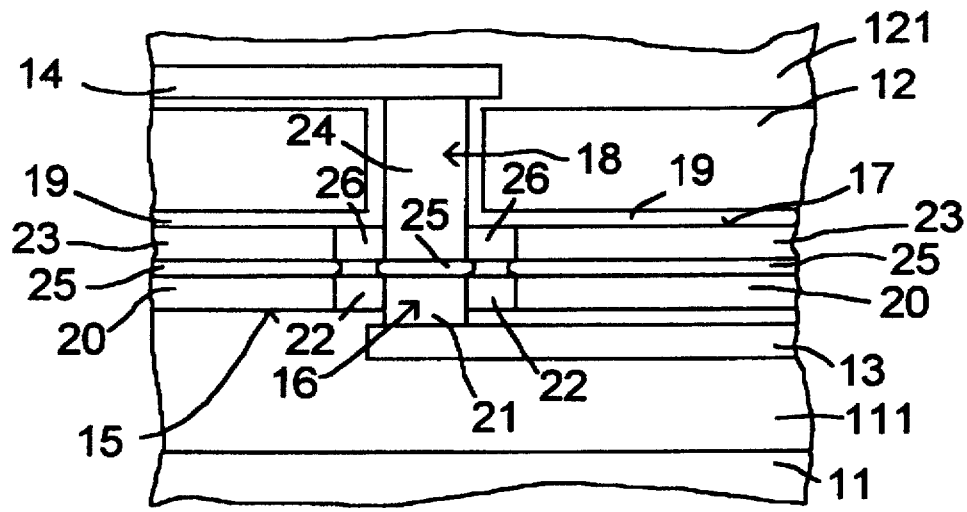
FIG. 1 shows two substrates which are connected to one another via soldered metal surfaces.

A first substrate 11 (see FIG. 1) which is, for example, a semiconductor wafer composed of monocrystalline silicon or a III-V semiconductor, comprises circuit structures which are an element of a microelectronic circuit or of an optoelectronic component or of a sensor component. The circuit structures, which are not illustrated in detail in FIG. 1, comprise at least one metallization layer 13, which is insulated from the substrate 11 by a $SiO_2$ layer 111. A second substrate 12 is, for example, a separate chip, which comprises a microelectronic circuit, an optoelectronic component or a sensor component. The circuit structures of the second substrate 12 are not illustrated in detail in FIG. 1.

They comprise at least one metallization layer 14, which is insulated from the substrate 12 by a $SiO_2$ layer 121. A first contact hole 16 is opened in a first main surface 15 of the first substrate 11. The first contact hole 16 extends as far as the metallization layer 13.

A second contact hole 18 is opened in a second main surface 17 of the second substrate 12. The second contact hole 18 extends as far as the metallization layer 14. The surface of the second substrate 12 is provided with an insulating layer 19 composed, for example, of $SiO_2$. In this case, the surface of the metallization layer 14 remains uncovered in the region of the second contact hole 18.

First metal surfaces 20 and a first contact 21 are formed by deposition of a tungsten layer over the entire area using, for example, a CVD method and subsequent structuring with the aid of a photolithographic method. The first contact 21 fills the first contact hole 16.

Insulating trenches 22 which are filled, for example, with polyimide or silicone are produced between the first metal surfaces 20 and the first contact 21.

Second metal surfaces 23 and a second contact 24 are produced on the second main surface 17 of the second substrate 12 by deposition of a nickel layer, for example by means of photolithography, over the entire area, for example using a CVD method and subsequent structuring. The second contact 24 completely fills the second contact hole 18. The second contact 24 and the second metal surfaces 23 form a planar surface which is parallel to the second main surface.

A solder metal 25 is applied onto the first metal surfaces 20 and the first contact 21. The solder metal 25 is composed, for example, of gallium. This does not wet the surface of the insulating trenches 22.

During the structuring of the nickel layer, second insulating trenches 26 are also formed between the second metal surfaces 23 and the second contact 24, and are filled with silicone or polyimide.

The first substrate 11 and the second substrate 12 are joined together such that the first main surface 15 and the second main surface 17 are adjacent to one another, and the first contact 21 meets the second contact 24, and the first metal surfaces 20 meet the second metal surfaces 23. An essentially mirror-image arrangement is produced during the structuring of the contacts and metal surfaces. The first insulating trenches 22 thus meet the second insulating trenches 26. The solder metal 25 is heated and melted. The second substrate 12 and the first substrate 11 are forced together under pressure, the liquid solder metal 25 mixing with the second metal surfaces 23 and the second contact 24, and solidifying to form an intermetallic phase. The liquid solder metal is applied at the same time.

If the first insulating trenches 22 and the second insulating trenches 26 have dimensions of at least one µm, and the layer thickness of the solder metal 25 is at most one µm, the first substrate 11 can be forced together with the second substrate 12 with a pressure of 10 kg per $cm^2$ in this arrangement, without any short circuits being produced via the liquid solder metal. During the soldering process, meniscuses are formed at the edges of the metal surfaces and contacts, which prevent liquid solder metal entering the region of the insulating trenches.

The solder metal 25 is preferably applied with a layer thickness such that the gallium component in the nickel remains less than 25 percent by weight after soldering. The intermetallic phase which is produced during soldering then has a melting temperature of more than 1200° C. For normal thicknesses of the contact holes and metal surfaces in the region of 1 to 2 µm, this is the case for a layer thickness of the solder metal 25 of at most 0.5 µm.

During heating of the solder metal 25, it is necessary to take care that the formation of the intermetallic phase does not start until both substrates are in contact via the liquid solder metal. This can be achieved by not heating until after the two substrates have been joined together or by using an appropriate metal, such as tungsten, for the first metal surfaces 20 and the first contact 21, and/or the provision of diffusion barrier layers, for example titanium or titanium nitride, on the surface of the first metal surfaces 20 and of the first contact 21.

After being soldered together, the first substrate 11 and the second substrate 12 are mechanically joined to one another via the first metal surfaces 20 and the second metal surfaces 23. The electrical connection is made via the first contact 21 and the second contact 24. In addition to mechanical connection, the soldered metal surfaces 20, 23 are also used to dissipate the heat from the upper layers to cooling surfaces which, as a rule, are mounted underneath the stack. The soldered metal surfaces 20, 23 can be electrically connected to ground or the operating voltage, so that they produce electrical shielding for the circuit structures in the two substrates. Furthermore, waveguide structures for horizontal lines can be implemented via the metal surfaces 20, 23.

After the first substrate 11 and the second substrate 12 have been joined together and have been soldered, it is expedient to test the circuit structures in the substrates. If it is found that the circuit structures in the second substrate 12 are faulty, then the second substrate 12 can be removed again by grinding away. During the grinding operation, the second metal surfaces 23 and the solder metal 25 are also removed. The grinding away is continued until at least the surface of the first metal surfaces 20 and of the first contact 21 are exposed. After a cleaning step, a second substrate can subsequently be applied and soldered once again, using the method according to the invention.

Figure 2:
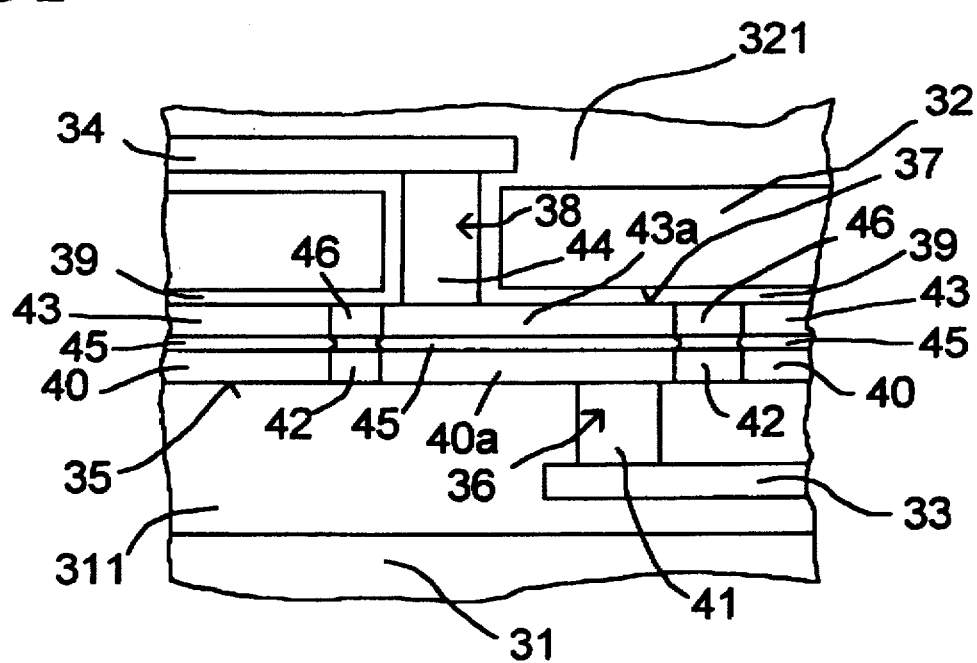
FIG. 2 shows two substrates which are connected to one another via soldered metal surfaces and in which one metal surface forms an interconnect between contacts, which meet one another in an offset manner, in both substrates.

A first contact hole 36, which extends as far as the metallization layer 33, is opened in a first main surface 35 of a first substrate 31 (see FIG. 2) which is constructed analogously to the first substrate 11 from FIG. 1 and comprises a metallization layer 33 which is insulated from the first substrate 31 by a $SiO_2$ layer 311. The first contact hole 36 is filled by a first contact 41 composed, for example, of tungsten. First metal surfaces 40, 40a are produced on the first main surface 35 by depositing a layer of, for example, tungsten over the entire area and subsequent structuring using photolithography. One of the first metal surfaces 40a covers the first contact 41 and overhangs it at the sides.

First insulating trenches 42 which are filled, for example, with silicone or polyimide are arranged between adjacent first metal surfaces 40.

A second substrate 32, which is constructed analogously to the second substrate 12 from FIG. 1, comprises at least one metallization layer 34, which is insulated from the substrate 32 by a $SiO_2$ layer 321. A second contact hole 38 is opened in a second main surface 37 of the second substrate 32. The second contact hole 38 extends as far as the metallization layer 34. The surface of the second substrate 32 is provided with an insulating layer 39 which is composed, for example, of $SiO_2$ and exposes the surface of the metallization layer 34.

A second contact 44 and second metal surfaces 43, 43a are formed by deposition of a nickel layer over the entire area and structuring, for example with the aid of photolithography. One of the two metal surfaces 43a covers the contact 41 and overhangs it at the sides. The second contact 44 essentially fills the second contact hole 38 and, with the second contact surfaces 43, forms a planar surface which is parallel to the second main surface 37. Insulating trenches 46, which are filled with polyimide or silicone, are produced on the second main surface 37, between the second metal surfaces 43 and the second contact 44.

Solder metal 45 is applied onto the first metal surfaces 40 of the first substrate 31. The solder metal 45 is composed, for example, of gallium and is applied with a thickness of, for example, 250 nm.

The second substrate 32 is joined to the first substrate 31 such that the first main surface 35 is adjacent to the second main surface 37, and such that the second metal surface 43a meets the first metal surface 40a.

A firm joint is formed between the first substrate 31 and the second substrate 32 in an analogous manner to that indicated with reference to FIG. 1, by heating and forcing the two substrates together. In this embodiment, an electrical connection is formed between the first contact 41 and the second contact 44 via the metal surfaces 40a and 43a, which overhang the contacts 41 and 44 at the sides. These metal surfaces 40a and 43a represent an interconnect which connects the two contacts.

Figure 3:
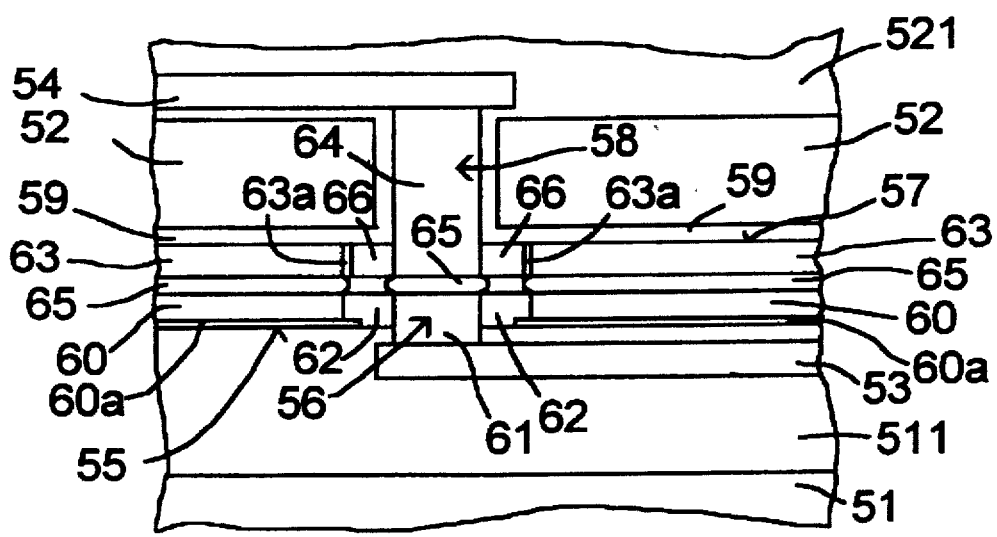
FIG. 3 shows two substrates which are connected to one another via soldered metal surfaces.

A first substrate 51 (see FIG. 3) which is, for example, a semiconductor wafer composed of monocrystalline silicon or a III-V semiconductor comprises circuit structures which are an element of a microelectronic circuit, an optoelectronic component, or a sensor component. The circuit structures, which are not illustrated in detail in FIG. 3, comprise at least one metallization layer 53, which is insulated from the substrate 51 by means of a $SiO_2$ layer 511. A second substrate 52 is, for example, a separate chip, which comprises a microelectronic circuit, an optoelectronic component or a sensor component. The circuit structures of the second substrate 52 are not illustrated in detail in FIG. 3. They comprise at least one metallization layer 54, which is insulated from the substrate 52 by a $SiO_2$ layer 521. A first contact hole 56 is opened in a first main surface 55 of the first substrate 51. The first contact hole 56 extends as far as the metallization layer 53.

A second contact hole 58 is opened in a second main surface 57 of the second substrate 52. The second contact hole 58 extends as far as the metallization layer 54. The surface of the second substrate 52 is provided with an insulating layer 59 composed of, for example, $SiO_2$. In this case, the surface of the metallization layer 54 remains uncovered in the region of the second contact hole 58.

An auxiliary layer 60a is produced on the first main surface 55 by deposition of material which cannot be wetted by the solder metal over the entire area, for example by sputtering and subsequent structuring with the aid of a photolithographic method.

First metal surfaces 60 and a first contact 61 are formed on the first auxiliary layer 60a by deposition of a tungsten layer over the entire area, for example using a CVD method and subsequent structuring with the aid of a photolithographic method. The first contact 61 fills the first contact hole 56.

The first auxiliary layer 60a is arranged under the first metal surfaces 60. Insulating trenches 62 are produced between the first metal surfaces 60 and the first contact 61. The first auxiliary layer 60a projects under the first metal surfaces 60 at the sides into the insulating trenches 62. There is a separation between the first auxiliary layer 60a and the first contact 61. The first auxiliary layer 60a is preferably formed from tungsten, tantalum, aluminum or polymer.

Second metal surfaces 23 and a second contact 24 are produced on the second main surface 17 of the second substrate 12 by deposition of a nickel layer, for example by means of photolithography, over the entire area, for example using a CVD method and subsequent structuring. The second contact 24 completely fills the second contact hole 18. The second contact 64 and the second metal surfaces 63 form a planar surface which is parallel to the second main surface.

During the structuring of the nickel layer, second insulating trenches 66 are also formed between the second metal surfaces 63 and the second contact 64.

A second auxiliary layer 63a is produced on the flanks of the second metal surfaces 63 by deposition over the entire area of material which cannot be wetted by the solder metal and anisotropic etching back. The second auxiliary layer 63a is designed as flank covering and covers only the flanks of the second metal surfaces 63. The second auxiliary layer 63a is preferably formed from tungsten, tantalum, aluminum or polymer.

Alternatively, the solder metal can also be oxidized (for example in an oxygen plasma). After the oxide has subsequently been etched back anisotropically, the oxide film is left as flank covering on the metal surfaces 63.

A further option is to cover the entire area of the wafer with a polymer, for example polyimide or photoresist, and to etch it back using an oxygen plasma or wet-chemically so far that the insulation trenches still remain entirely or partially filled.

The trenches can thus be filled with an insulator even when, for example for corrosion reasons, the trenches must not remain open.

A solder metal 65 is applied onto the first metal surfaces 60 and the first-contact 61. The solder metal 65 is composed, for example, of gallium. This does not wet the surface of the first auxiliary layer 60a and of the second auxiliary layer 63a.

The first substrate 51 and the second substrate 52 are joined together such that the first main surface 55 and the second main surface 57 are adjacent to one another, the first contact 61 meets the second contact 64, and the first metal surfaces 60 meet the second metal surfaces 63. An air or barrier-gas atmosphere which is enclosed between the first substrate 51 and the second substrate 52 can in this case escape via the first insulating trenches 62 and the second insulating trenches 66.

An essentially mirror-image arrangement is produced in the structuring of the contacts and metal surfaces. The first insulating trenches 62 thus meet the second insulating trenches 66. The solder metal 65 is heated and melted. The second substrate 52 and the first substrate 51 are forced together under pressure, the liquid solder metal 65 mixing with the second metal surfaces 63 and the second contact 64 and solidifying to form an intermetallic phase. The solder metal 65 is consumed entirely in this process.

If the first insulating trenches 62 and the second insulating trenches 66 have dimensions of at least one µm, and the layer thickness of the first auxiliary layer 60a and of the second auxiliary layer 63a is in each case 100 nm and the layer thickness of the solder metal 65 is at most one µm, the first substrate 51 can be forced together with the second substrate 52 with a pressure of 10 kg per cm$^2$ in this arrangement, without any short circuits being produced via the liquid solder metal. During the soldering process, meniscuses are formed at the edges of the metal surfaces and contacts, which prevent liquid solder metal entering the region of the insulating trenches.

The solder metal 65 is preferably applied with a layer thickness such that the gallium component in the nickel remains less than 25 percent by weight after soldering. The alloy which is produced during soldering then has a melting temperature of more than 1200° C. For normal thicknesses of the contact holes and metal surfaces in the region of 1 to 2 µm, this is the case for a layer thickness of the solder metal 65 of at most 0.5 µm.

During heating of the solder metal 65, it is necessary to take care that the formation of the intermetallic phase does not start until both substrates are in contact via the liquid solder metal. This can be achieved by not heating until after the two substrates have been joined together or by using an appropriate metal, such as titanium, for the first metal surfaces 60 and the first contact 61, and/or the provision of diffusion barrier layers, for example titanium nitride, on the surface of the first metal surfaces 60 and of the first contact 61.

After being soldered together, the first substrate 51 and the second substrate 52 are mechanically joined to one another via the first metal surfaces 60 and the second metal surfaces 63. The electrical connection is made via the first contact 61 and the second contact 64. In addition to mechanical connection, the soldered metal surfaces 60, 63 are also used to dissipate the heat from the upper layers to cooling surfaces which, as a rule, are mounted underneath the stack. The soldered metal surfaces 60, 63 can be electrically connected to ground or the operating voltage, so that they produce electrical shielding for the circuit structures in the two substrates. Furthermore, waveguide structures for horizontal lines can be implemented via the metal surfaces 60, 63.

After the first substrate 51 and the second substrate 52 have been joined together and have been soldered, it is expedient to test the circuit structures in the substrates. If it is found that the circuit structures in the second substrate 52 are fault, then the second substrate 52 can be removed again by grinding away. During the grinding operation, the second metal surfaces 63 and the solder metal 65 are also removed. The grinding away is continued until at least the surface of the first metal surfaces 60 and of the first contact 61 are exposed. After a cleaning step, a second substrate can subsequently be applied and soldered once again, using the method according to the invention.

The method according to the invention has been indicated on the basis of the joining of two substrates. Any desired number of substrates can be stacked one above the other and can be firmly joined to one another using the method according to the invention. A stack composed of n substrates can be joined together according to the invention by using a first substrate, which is already a stack of n−1 substrates produced according to the invention, with a further substrate.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing a three-dimensional circuit arrangement, comprising the steps of:

providing at least a first substrate and a second substrate, each of said first and second substrates having at least one component;

arranging above one another in a stack the first substrate and the second substrate;

applying main metal surfaces onto a main surface of at least one substrate of the first and second substrates which is adjacent to the other substrate of the first and second substrate;

soldering the main metal surfaces to an adjacent main surface of the other substrate by application of solder metal and heating, the solder metal mixing completely with a material of the main metal surfaces so that an intermetallic phase is formed, and a firm joint is produced between the first substrate and the second substrate;

matching the material of the main metal surfaces and the solder metal to one another such that a melting temperature of the intermetallic phase is higher than an operating temperature of the three-dimensional circuit arrangement and is higher than a melting temperature of the pure solder metal;

forming insulating trenches between the main metal surfaces and adjacent contacts which are arranged on a common main surface.

2. The method as claimed in claim 1, wherein the metal surfaces include nickel and the solder metal includes gallium, wherein a quantity of solder metal is dimensioned such that an intermetallic phase having a gallium component of a maximum of 25 percent by weight forms after complete mixing with the material of the metal surfaces.

3. The method as claimed in claim 1, wherein additional metal surfaces, each of which are adjacent to one of the main metal surfaces, are applied on a main surface of the respective other substrate, wherein the main metal surfaces are soldered to the adjacent additional metal surfaces.

4. The method as claimed in claim 3, wherein the additional metal surfaces are formed from tungsten.

5. The method as claimed in claim 1, wherein contacts in both of the first and second substrates are adjacent to the main surface which is adjacent to the other substrate, wherein, during soldering, the solder metal forms an electrical connection between contacts, on the first substrate and on the second substrate.

6. The method as claimed in claim 1, wherein the insulating trenches are filled with material which is not wetted by the solder metal.

7. The method as claimed in claim 6, wherein the insulating trenches have a width of at least 1 μm, wherein the solder metal is applied as a layer with a thickness of at most 1 μm, wherein the insulating trenches are filled with polyimide or silicone.

8. The method as claimed in claim 1, wherein base of the insulating trench is at least partially covered by an auxiliary layer which is not wettable by the solder metal, wherein the auxiliary layer covers at least an edge of the base of the insulating trench.

9. The method as claimed in claim 8, wherein the auxiliary layer covers flanks of the metal surfaces which are adjacent to the insulating trenches.

10. The method as claimed in claim 8, wherein the auxiliary layer is arranged under the metal surface.

11. The method according to claim 1, wherein the auxiliary layer is formed from tungsten, tantalum, aluminum, titanium oxide, tantalum oxide, chromium oxide, a nitride or a polymer.

12. The method as claimed in claim 5, wherein at least one metal surface is formed for the electrical connection of a first contact in the first substrate and a second contact in the second substrate, which do not meet one another in a region of the mutually adjacent main surfaces, such that said metal surface forms an interconnect between the first contact and the second contact.

13. The method as claimed in claim 1, wherein a diffusion barrier layer is applied onto the main metal surfaces before the application of the solder metal, which diffusion barrier layer delays diffusion of the solder metal into the main metal surfaces.

14. The method as claimed in claim 1, wherein, after the first substrate and the second substrate have been joined by soldering, the components of the first and second substrates are tested, wherein, if faulty components occur, the substrate including is removed by grinding away, wherein the solder metal is removed during the grinding away and is ground as far as the metal surfaces which are arranged on the remaining substrate, such that a new substrate can be soldered via these metal surfaces to the remaining substrate.

* * * * *